United States Patent [19]

Hayashida et al.

[11] Patent Number: 5,840,127
[45] Date of Patent: Nov. 24, 1998

[54] SURFACE TREATING AGENTS AND TREATING PROCESS FOR SEMICONDUCTORS

[75] Inventors: Ichiro Hayashida; Masahiko Kakizawa, both of Kawagoe, Japan

[73] Assignee: Wako Pure Chemical Industries, Ltd., Osaka, Japan

[21] Appl. No.: 685,008

[22] Filed: Jul. 22, 1996

Related U.S. Application Data

[62] Division of Ser. No. 370,194, Jan. 9, 1995, Pat. No. 5,580,846.

[30] Foreign Application Priority Data

Jan. 28, 1994 [JP] Japan .................................. 06-026291

[51] Int. Cl.$^6$ ....................................................... B08B 3/00
[52] U.S. Cl. ................................. 134/2; 134/26; 134/28; 134/29
[58] Field of Search ............................. 134/2, 3, 26, 28, 134/29

[56] References Cited

U.S. PATENT DOCUMENTS

| | | |
|---|---|---|
| 4,972,837 | 11/1990 | Engelstad et al. . |
| 4,987,253 | 1/1991 | Bergeron . |
| 5,011,976 | 4/1991 | Watts . |
| 5,290,361 | 3/1994 | Hayashida et al. . |
| 5,538,670 | 7/1996 | Ritschkoff et al. . |

*Primary Examiner*—Jill Warden
*Assistant Examiner*—Alexander Markoff
*Attorney, Agent, or Firm*—Armstrong, Westerman, Hattori, McLeland & Naughton

[57] ABSTRACT

The concentration of Al on silicon surface is reduced to lose its influence on the growth rate of an oxide film during thermal oxidation when semiconductor surface treatment is carried out by a process for treating semiconductor surfaces which comprises a step of cleaning surfaces of semiconductors with a semiconductor surface treating agent comprising an inorganic or organic alkali, hydrogen peroxide and water as major components, and a step of rinsing the resulting surfaces with ultra-pure water, at least one of the semiconductor surface treating agent and the ultra-pure water containing as a complexing agent a compound having three or more

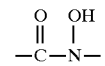

groups in the molecule or a salt thereof.

4 Claims, 2 Drawing Sheets

F I G. 1
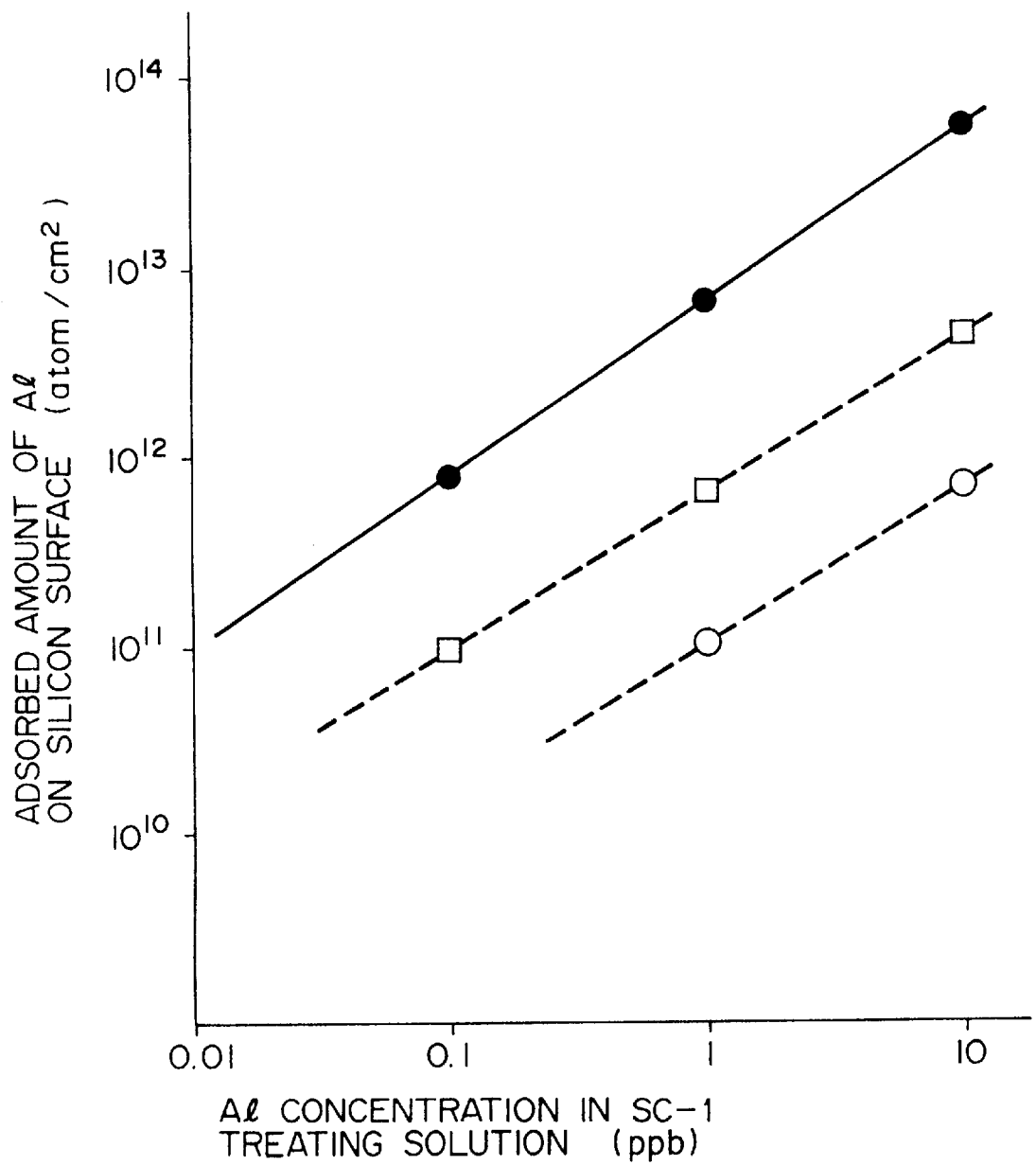

SURFACE TREATING AGENTS AND TREATING PROCESS FOR SEMICONDUCTORS

This is a Division of application Ser. No 08/370,194, filed Jan. 9, 1995, now U.S. Pat. No 5,580,846.

BACKGROUND OF THE INVENTION

This invention relates to improvements in surface treating agents for improving the cleaning of the surfaces of semiconductors and LCD.

Particularly, the present invention relates to improved surface treating agents and an improved treating process which are used for cleaning to remove, for example, contamination with organic materials, fine particulates and metals on the surface of silicon, germanium, and compound semiconductors (e.g. Ga-As, Ga-P, etc.), which are often used for the production of semiconductors, integrated circuits, LCD, etc., the surface of films contacting with semiconductors, or at least one surface of glass substrates, and are thus effective in improving the surface cleaning to increase the yield of products.

At present, semiconductor devices such as LSI, IC, diodes, commutators, etc. are mostly silicon devices which are produced by subjecting a silicon wafer to processing steps such as vapor phase growth, oxide film formation, impurity diffusion, vapor phase deposition of electrode metal, etc.

Since contamination with impurities has remarkable undesirable influences on characteristics of semiconductors, it is necessary to clean silicon wafer surfaces sufficiently for removing contamination prior to the above-mentioned processing steps. Various industrial cleaning methods which are different as for treating chemicals, treating temperature, etc. have been employed. A series of treatments called "RCA cleaning method" (RCA Review pp. 187–206, June, 1970, etc.) appeared in the mid-1970s and have been used widely since that time and become a major method for wet cleaning. The RCA cleaning method is a combination of (i) SC-1 treatment using ammonia, hydrogen peroxide and water and effective in removing contamination with organic materials and a part of metals such as Cu, Ag, etc., particularly effective in removing contamination with fine particulates, (ii) a dilute HF treatment for removing natural silicon oxide films, and (iii) SC-2 treatment using hydrochloric acid, hydrogen peroxide and water, and remarkably effective for removing metal contamination.

The sequence of RCA cleaning method generally used is SC-1 treatment→dilute HF treatment→SC-2 treatment. But the dilute HF treatment easily gives fine particulates contamination on the surface of silicon wafer and the SC-2 treatment is poor for removing fine particulates. With recent ultra-high integration of LSI, device patterns are rapidly miniaturized and the size of fine particulates which damage devices is also remarkably miniaturized. The smaller the size of fine particulates becomes, the stronger their adhesive strength for wafers becomes. Thus, the removal of fine particulates becomes more difficult, so that the production yield is strongly dependent on the ability to remove fine particulates contamination at the time of cleaning. In order to remove the particulates more effectively, attempts were made to conduct the SC-1 treatment at the last step of cleaning sequence. But it is known that metallic impurities are adsorbed on the surface of a wafer subjected to such a cleaning sequence and cause troubles such as deterioration in oxide breakdown voltage and abnormal growth of an oxide film formed by thermal oxidation.

Metallic elements detected on the surface of wafer after the SC-1 treatment are Fe, Al, Ca, Mg, Zn, etc. At first these contaminating metals are derived from the production apparatus for the processing step before the cleaning step or derived from circumstances. They consist of the elements which are not removed due to insufficient cleaning ability of SC-1, and the elements adsorbed on the wafer from the treating solution including these metal elements.

When the SC-1 treatment is employed, Fe and Al are particularly liable to be adsorbed and retained and are difficult to remove, as compared with the other elements. In a mass production factory, as a high-productivity cleaning apparatus, there is commonly used a Tact method wherein wafers entered in a carrier are passed to cleaning baths one after another. Thus, contaminating elements released in the liquid of a SC-1 treating bath by cleaning are gradually accumulated to provide an undesirable contamination by adsorption on succeeding wafers. Further, since Al is used as a wiring material in semiconductor devices, contamination with Al is unavoidable. In addition, when ammonia and hydrogen peroxide with extremely high purity are not used, there takes place contamination by adsorption of impurities in the cleaning chemicals. In the production and storing of hydrogen peroxide, since metals such as Al are used, it is particularly necessary to highly purify the hydrogen peroxide used for semiconductor cleaning. Further, these highly pure chemicals are easily contaminated in vessels for transport or in feeding system to cleaning baths, so that it is not easy to maintain the purity of these chemicals at very high level in cleaning baths.

Usually, after the SC-1 treatment, the surface of wafer is contaminated with about $10^{11}$ to $10^{12}$ atoms/cm$^2$ of Fe, about $10^{11}$ to $10^{13}$ atoms/cm$^2$ of Al, and about $10^{10}$ to $10^{11}$ atoms/cm$^2$ in the cases of Ca, Mg and Zn. Of such metal contaminations, the Fe contamination shortens the lifetime at a Fe concentration of $10^{11}$ atoms/cm$^2$ or more, and the Al contamination causes abnormal growth of an oxide film at an Al concentration of $10^{12}$ atoms/cm$^2$ or more. Therefore, it is necessary to make the concentrations of Fe and Al as low as about $10^{10}$ atoms/cm$^2$ and about $10^{11}$ atoms/cm$^2$, respectively. It was extremely difficult to obtain such a degree of cleanness only by the SC-1 treatment.

As another cleaning method similar to the SC-1 treatment, there is known a method using an organic alkali and hydrogen peroxide. For example, there are disclosed tetramethylammonium hydroxide (TMAH) and hydrogen peroxide (Japanese Patent Unexamined Publication No. 50-147284), trialkyl(hydroxyalkyl)ammonium hydroxide and hydrogen peroxide (Japanese Patent Examined Publication No. 53-43012, U.S. Pat. No. 4,239,661, U.S. Pat. No. 4,339,340), etc. These methods are excellent in fine particulates removing ability which is characteristic of treatment with alkali and hydrogen peroxide, like the SC-1 treatment. But the methods cause serious adsorption of Fe, Al, etc. from the treating solution and hence are not sufficient in cleaning ability for wafers contaminated with Fe, Al, etc. A method of catching metallic impurities as stable water-soluble complex to make them inactive to a material to be cleaned is a conventional method for formulating usual cleaning agents. For example, addition of a complexing agent to TMAH and hydrogen peroxide is disclosed in Japanese Patent Unexamined Publication No. 50-158281, and addition of a complexing agent to trialkyl(hydroxylamine)ammonium hydroxide and hydrogen peroxide is disclosed in Japanese Patent Examined Publication No. 53-20377, U.S. Pat. No. 4,239,661 and U.S. Pat. No. 4339340. In each case, the added amount of the complexing agent should be 0.01% by weight or more. Addition of a cyano compound is dangerous. When an organic compound such as ethylenediamine tetraacetic acid (EDTA), triethanolamine, etc. is added in an amount of as much as 100 ppm as described in them, harmful carbon contamination takes place on silicon surface to cause problems in electrical properties.

The "alkali and hydrogen peroxide" cleaning which is very effective against contamination with fine particulates is not sufficient by itself in cleaning efficiency for harmful metallic impurities such as Fe and Al. The method of adding a large amount of a complexing agent deteriorates electrical properties and hence is not practical. As a method for solving this problem, addition of a phosphonic acid type complexing agent to an alkali and hydrogen peroxide in an amount of $10^{-3}\%$ by weight or less has been reported in Japanese Patent Unexamined Publication No. 5-275405 (U.S. Pat. No. 5,290,361). In the case of using a phosphonic acid type complexing agent, when its added amount is $10^{-3}\%$ by weight or less, a wafer treated by such a method does not show an undesirable influence of contamination with organic materials on electrical properties, and the Fe concentration can be limited to about $10^{10}$ atoms/cm$^2$. However, the complex formation rate for Al becomes slow, resulting in insufficient effect. Therefore, the Al concentration is at least about $10^{11}$ atoms/cm$^2$ on the treated wafer surface. It is known that contamination of silcon surface with Al affects the growth rate of an oxide film during thermal oxidation. This is not desirable from the viewpoint of precise control of the process.

As described above, the "alkali and hydrogen peroxide" cleaning very effective against contamination with fine particulates is not sufficient in cleaning efficiency for Al, one of the harmful metallic impurities. An effective means for solving this problem has not yet been found.

SUMMARY OF THE INVENTION

It is an object of the present invention to solve the problems in conventional alkali surface treating agents described above, and provide improved surface treating agents and an improved surface treating process which prevent Al contamination caused by adsorption from a treating agent and have a high cleaning efficiency.

The present invention provides a process for treating semiconductor surfaces, which comprises a step of cleaning surfaces of semiconductors with a semiconductor surface treating agent comprising an inorganic or organic alkali, hydrogen peroxide and water as major components, and a step of rinsing the resulting surfaces with ultra-pure water, at least one of the semiconductor surface treating agent and the ultra-pure water containing a complexing agent having three or more

groups in the molecule or a salt thereof (the complexing agent or a salt thereof is hereinafter referred to as "complexing agent of the present invention").

The present invention also provides the process described above wherein the treatment is carried out in the presence of a chelating agent having one or more phosphonic acid groups or a salt thereof in the molecule, an oxidized form thereof, or a polyphosphoric acid or a salt thereof (the chelating agent or an oxidized form thereof and the polyphosphoric acid or a salt thereof are abbreviated as "Fe-removing complexing agents") in addition to the complexing agent of the present invention.

The present invention further provides a surface treating agent for semiconductors comprising an inorganic or organic alkali, hydrogen peroxide, water and the above-mentioned complexing agent of the present invention.

The present invention still further provides a surface treating agent for semiconductors comprising an inorganic or organic alkali, hydrogen peroxide, water, the above-mentioned complexing agent of the present invention, and the Fe-removing complexing agent.

The present invention still further provides a process for preparing each of the above-mentioned surface treating agents for semiconductors which comprises incorporating the complexing agent of the present invention into one or more of the components which constitute the surface treating agent for semiconductors and then mixing the components, or comprises mixing the components which constitute the surface treating agent for semiconductors and then incorporating the complexing agent of the present invention into the resulting mixture.

The present invention still further provides an alkali aqueous solution for preparing a semiconductor surface treating agent which contains the above-mentioned complexing agent of the present invention.

The present invention still further provides a hydrogen peroxide solution for preparing a semiconductor surface treating agent which is obtained by purification by distillation and removal treatment of metal impurities, followed by addition of the above-mentioned complexing agent of the present invention.

The present invention still further provides a process for treating semiconductor surfaces, which comprises treating surfaces of semiconductors by using a hydrogen peroxide solution containing the complexing agent of the present invention, as a constituent of a semiconductor surface treating agent.

The present invention still further provides a process for treating semiconductor surfaces, which comprises treating surfaces of semiconductors by using an alkali aqueous solution containing the complexing agent of the present invention, as a constituent of a semiconductor surface treating agent.

The present invention still further provides a process for treating semiconductor surfaces, which comprises treating surfaces of semiconductors by using water containing the complexing agent of the present invention, as a constituent of a semiconductor surface treating agent.

BRIEF DESCRIPTION OF THE DRAWINGS

FIG. 1 is a graph (Freundlich plots) showing a relationships between the Al concentration in SC-1 treating solution (ppb) and the adsorbed amount of Al (atom/cm$^2$) on surface of silicon wafer obtained in Example 1 and Comparative Example 1.

DESCRIPTION OF THE PREFERRED EMBODIMENTS

Figure 2:
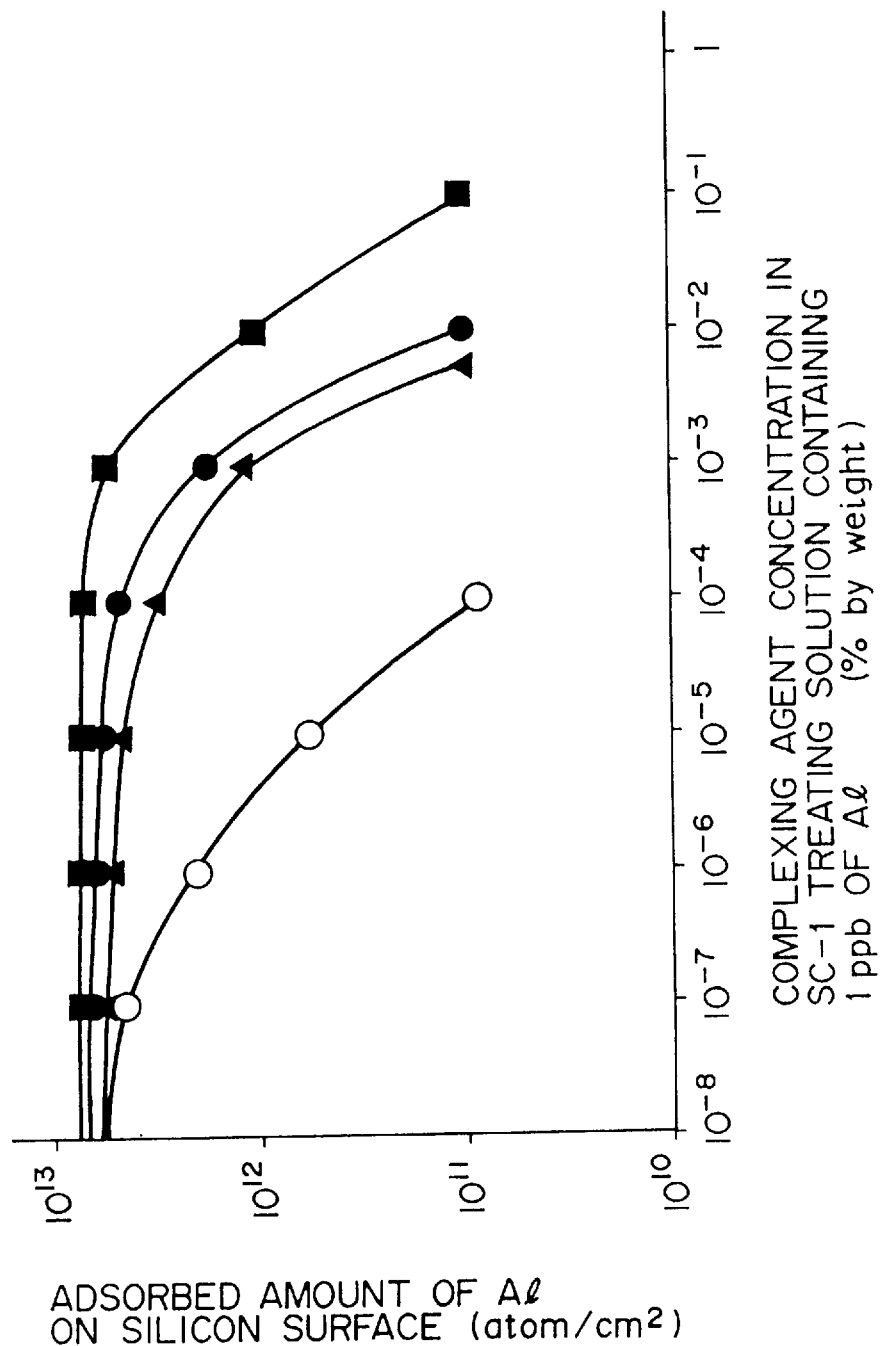
FIG. 2 is a graph showing a relationship between the concentration of complexing agent (% by weight) in SC-1 treating solution containing 1 ppb of Al and the adsorbed amount of Al (atom/cm$^2$) on surface of silicon wafer obtained in Example 2.

It is known that contamination of silcon wafer surface with Al affects the growth rate of an oxide film during thermal oxidation. In general, a large amount of Al remains on silicon wafer surface subjected to the "alkali and hydrogen peroxide" cleaning. The problems of the Al adsorption and the cleaning ability deficiency can be sufficiently solved by the present invention. As can be seen from Comparative Example 1 hereinafter described, in order to control the concentration of Al on silicon wafer surface after SC-1 cleaning below $10^{11}$ atoms/cm² or less, the Al concentration in the SC-1 treating solution should be maintained at 0.01 ppb or less. In the cleaning equipments of common semiconductor factories, the wafers pass through the cleaning solution in the bath one after another and the contaminants accumulate in the solution. In practical cases, the concentration of Al on the silicon wafer surface after the SC-1 treatment is usually $10^{12}$ to $10^{13}$ atoms/cm² as described above. From FIG. 1, the practical concentration of Al in the SC-cleaning bath can be guessed as about 0.01 to 0.1 ppb. As is clear from FIG. 2, even when the treatment is carried out by adding a typical chelating agent such as EDTA to a SC-1 treating solution containing 1 ppb of Al, an Al absorbed amount of only about $10^{11}$ atoms/cm² can be attained at a chelating agent concentration of $10^{-2}\%$ by weight.

According to the experience, organic materials difficultly decomposable into low-boiling materials which are contained in the "alkali and hydrogen peroxide" treating agent affect the yield of devices unless their amount is $10^{-4}\%$ by weight or less in terms of carbon concentration. Therefore, each of various complexing agents was added to a SC-1 cleaning solution containing 1 ppb of Al, in an amount of $10^{-4}\%$ by weight, and adsorbed amounts of Al on silicon wafer surface were compared. When there was added each of EDTA, 1,2-cyclohexanediaminetetraacetic acid (CyDTA), triethylenetetraminehexaacetic acid (TTHA) and nitrilotriacetic acid (NTA) which have almost the same high complex-formation constant for Al, the Al density on silicon wafer surface was substantially the same as when no chelating agent was added. In the present invention, its objects are achieved by adding a specific complexing agent, and the effect of the complexing agent is enhanced for obtaining a sufficient effect by adding the complexing agent in an amount as small as possible.

That is, the present inventors earnestly investigated the mechanism of metal adsorption on silicon wafer surface in order to achieve the above objects, and consequently concluded that the adsorption is caused by hydrogen bond interacting between the OH groups coordinated to the metal ion and OH groups and H atoms present on the silicon wafer surface, and that the contamination caused by adsorption can be reduced by including a complexing agent capable of inhibiting the coordination of OH groups to metal ion, in a semiconductor surface treating agent or a rinsing solution. Thus, the present invention has been accomplished.

The complex formation reaction means a competitive reaction of metal ions and H atoms against the complexing agent in the acidic region, and a competitive reaction of the complexing agent and OH groups against metal ions in the alkaline region. That is, if the reaction of the complexing agent for metal ions (complex formation reaction) is faster than the reaction of OH groups for metal ions (hydroxide formation reaction), and the complex formed by the reaction is stable and water-soluble, the complexing agent can inhibit the hydroxide formation of metal ions present in the alkaline solution. Further, since the complexing agent having a marked complex formation ability can also dissolve the hydroxide, the present inventors considered that the utilization of the complex formation reaction permits not only inhibition of coordination of OH groups against the metal but also dissolution of the adsorbed metallic impurities.

As a result of earnest study, the present inventors chose compounds having three or more

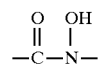

groups, as the potent complexing agent for inhibiting the coordination of OH groups. That is, the present inventors found the following: all of these complexing agents of the present invention have such a large complex formation constant for metal ions (e.g. Al ions) that the coordination of OH groups can be sufficiently inhibited, their complex formation reaction is easy and rapid, and the complex formed is stable and water-soluble. Thus, the present invention has been accomplished.

As the compounds having in the molecule three or more

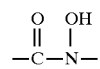

groups according to the present invention, there can be used N,N',N"-tris[2-(N-hydroxycarbamoyl)ethyl]-1,3,5-benzenetricarboxamide (BAMTPH), desferricrocin, desferrimycin, desferrioxamine (or deferrioxamine) A, B, $D_1$, $D_2$, E and G, N-formyl-desferrioxamine E, N-acetyl-desferrioxamine G, desferrirhodin, desferrirubin, desferrichrome, desferrichrome A, desferrichrysin, and hydrochlorides of these compounds (complexing agents), sulfates of these compounds, phosphates of these compounds, nitrates of these compounds, methanesulfonates (mesylates) of these compounds, ethanesulfonates of these compounds, ammonium salts of these compounds, and alkali metal (e.g. K, Li) salts of these compounds, etc.

For example, when desferricrocin was added to a SC-1 cleaning solution containing 1 ppb of Al to adjust its concentration to $10^{-4}\%$ by weight, the adsorbed amount of Al was $10^{11}$ atoms/cm² or less (the desired value), namely, the Al adsorbed amount was clearly different from that obtained in the case of using a conventional chelating agent. The same effect can be obtained also when any of other complexing agents of the present invention is used. Further, the cleaning efficiency can also be improved. For example, the remaining rate after cleaning a Al contaminated silicon wafer becomes about one-tenth as low as that obtained in the case of using a conventional complexing agent.

The above-exemplified complexing agents of the present invention may be used singly or as a mixture of two or more thereof. The content of the complexing agent of the present invention in the whole solution of the semiconductor surface treating agent is usually in the range of $10^{-7}$ to $10^{-3}\%$ by weight, preferably $10^{-6}$ to $10^{-4}\%$ by weight. When the content isbeyond the above range, harmful carbon contamination takes place on the surface. On the other hand, the content is below the above range, no sufficient cleaning efficiency can be expected.

The semiconductor surface treating agent of the present invention usually comprises as major components an inorganic or organic alkali, hydrogen peroxide and water. As the inorganic alkali used in the present invention, ammonia is exemplified and is used usually in the form of a 20 to 30% by weight aqueous solution. As the organic alkali used in the present invention, quaternary ammonium hydroxides are first exemplified and are used usually in the form of a 0.5 to 10% by weight aqueous solution. Typical and specific examples of the quaternary ammonium hydroxides are trimethyl-2-hydroxyethylammonium hydroxide, tetramethyl-ammonium hydroxide (TMAH), etc. The quaternary ammonium hydroxides are not limited to them. The organic alkali used in the present invention is not limited to the quaternary ammonium hydroxides. For example, guanidine carbonate can be used in the same concentration as described above. The inorganic or organic alkali is used in a concentration of usually 0.01 to 30% by weight, preferably 0.01 to 20% by weight, based on the weight of the whole solution of the semiconductor surface treating agent.

Hydrogen peroxide is used usually in the form of a 20 to 40% by weight aqueous solution. Hydrogen peroxide is used in a concentration of 0.01 to 30% by weight based on the weight of the whole solution of the semiconductor surface treating agent. Even if the concentration is outside the above range, the cleaning efficiency is not particularly influenced.

Although the complexing agent of the present invention is used usually in the form of a solution in any one, any two or all of the components which constitute the semiconductor surface treating agent, i.e., the above-mentioned alkali, hydrogen peroxide solution and water, the complexing agent may be used in the form of a solution in a mixture of the alkali, hydrogen peroxide solution and water. That is, a method for incorporating the complexing agent of the present invention into the semiconductor surface treating agent is not particularly limited.

When the complexing agent of the present invention is added to water for rinsing (usually ultra-pure water being used), exactly the same improved effects can be obtained.

In the present invention, when the complexing agent of the present invention is added to a hydrogen peroxide solution, the hydrogen peroxide solution is preferably one which has been purified by distillation and then freed of metallic impurities. But even if the hydrogen peroxide solution is an unpurified one, sufficient effects can be obtained.

Since the semiconductor surface treating agent of the present invention has excellent inhibitory effects on adsorption and high cleaning efficiency even at ordinary temperature, no intentional heating is necessary at all. Needless to say, the effects of the semiconductor surface treating agent are not changed even when proper heating is conducted.

The semiconductor surface treating agent of the present invention may contain various auxiliaries (e.g. surfactants) in addition to the alkali, hydrogen peroxide, water and the complexing agent of the present invention so long as the effects of the present invention are not lessened.

Furthermore, the semiconductor surface treating agent of the present invention exhibits excellent inhibitory effects on adsorption and high cleaning efficiency even in a dipping treatment in which silicon wafers are merely immersed in treating solution. Its effects can be further improved by promoting the cleaning mechanically and physically by pouring a shower of treating solution on silicon wafers or accelerating the flow of semiconductor treating solution by use of an ultrasonic cleaner or the like during dipping treatment.

The complexing agent of the present invention is very effective in removing Al (hereinafter referred to as "Al-removing complexing agent") but is not sufficiently effective in removing Fe.

Therefore, in actual surface treatment, it is preferable to use the Al-removing complexing agent in combination with other complexing agents effective for removal of Fe (Fe-removing complexing agents) as described in Japanese Patent Unexamined Publication No. 5-275405 and U.S. Pat. No. 5,290,361. The Fe-removing complexing agents are compounds having one or more phosphonic groups or salts thereof in the molecule or oxidized forms thereof, for example, ethylidene diphosphonic acid, diethylenetriaminepenta(methylene phosphonic acid), methyl diphosphonic acid, nitryrotris(methylene phosphonic acid), ethylenediaminetetrakis(methylene phosphonic acid), ammonium salts of these compounds, alkali metal salts (not including Na salts) of these compounds; and polyphosphoric acids and salts thereof, for example, hexametaphosphoric acid, tetrametaphosphoric acid, ammonium salts of these polyphosphoric acids, and alkali metal salts (not including Na salts) of these polyphosphoric acids. It is also possible to use as the Fe-removing complexing agent 1,2-propylenediamine tetra(methylenephosphonic acid) (disclosed in U.S. Pat. No. 5,302,311). When the above-exemplified Fe-removing complexing agents are used in combination with the complexing agent of the present invention (for removing Al), Al and Fe can be effectively removed at the same time without inhibiting the Al removing effect of the complexing agent of the present invention.

Although the Fe-removing complexing agent is used usually in the form of a solution in any one, any two or all of the components which constitute the semiconductor surface treating agent, i.e., the above-mentioned alkali, hydrogen peroxide solution and water, the Fe-removing complexing agent may be used in the form of a solution in a mixture of the alkali, hydrogen peroxide solution and water. That is, a method for incorporating the Fe-removing complexing agent into the semiconductor surface treating agent is not particularly limited.

When the Fe-removing complexing agent is added to water for rinsing (usually ultra-pure water being used), exactly the same improved effects can be obtained.

In the present invention, when the Fe-removing complexing agent is added to a hydrogen peroxide solution, the hydrogen peroxide solution is preferably one which has been purified by distillation and then freed of metallic impurities. But even if the hydrogen peroxide solution is an unpurified one, sufficient effects can be obtained.

As complexing agents effective for removal of Fe, there can be of course used, in combination with the above-exemplified complexing agents, other complexing agents such as EDTA, triethanolamine, etc., which have heretofore been used in the art for Fe removal, and other chelating agents usable for Fe removal.

The present invention is illustrated below with reference to Examples and Comparative Examples. In the Examples and Comparative Examples, percents are all by weight unless otherwise specified.

In the Examples and Comparative Examples, the Al concentration on the surface of a wafer was measured by dissolving Al in a small amount of ultra-pure dilute hydrofluoric acid sandwiched between a cleaned sheet of polytetrafluoroethylene and a wafer surface, followed by determination by graphite furnace atomic-absorption spectroscopy.

In the Examples and Comparative Examples, there were used 28% ammonia water and 35% hydrogen peroxide solution, unless otherwise specified, and the units of concentration, i.e., percents, ppm and ppb are all by weight. In addition, all the chemicals used in the Examples and Comparative Examples were ultra-pure products containing Al in an amount of 0.1 ppb or less, admitted by graphite furnace atomic-absorption spectroscopy. The water used was ultra-pure water containing Al in an amount of about 0.01 ppb, admitted by graphite furnace atomic-absorption spectroscopy.

EXAMPLE 1

To a mixed solution of 1 part by volume of ammonia water, 1 part by volume of hydrogen peroxide solution and 5 parts by volume of water (hereinafter abbreviated as "SC-1 cleaning solution"), desferrichrome A was added in an amount of $10^{-4}\%$ or $10^{-5}\%$ to prepare a series of treating solutions. Then, Al was added to the treating solutions in amounts of 10 ppb, 1 ppb and 0.1 ppb, respectively. In each treating solution, a 5 inch wafer of P-type with several Ω.cm and crystal orientation(100) was immersed and treated at 70° C. for 10 minutes, followed by rinsing with ultra-pure water for 10 minutes (hereinafter, the treating conditions for the wafer and with SC-1 cleaning solutions are the same as above). Then, the concentration of Al adsorbed on the wafer surface was determined. The results of the above adsorption experiment are shown by Freundlich plots in FIG. 1; -○- (open circle): desferrichrome A $10^{-4}\%$ added, -□- (open square): desferrichrome A $10^{-5}\%$ added.

Comparative Example 1

In the same manner as in Example 1, there was tested the adsorption of Al from the same SC-1 treating solutions (containing no desferrichrome A) as used in Example 1. The results obtained are shown by Freundlich plots in FIG. 1 by -●- (closed circle).

In the case of no addition of desferrichrome A, when 1 ppb of Al is present in the SC-1 treating solution, the adsorbed amount of Al is about $3 \times 10^{12}$ atoms/cm$^2$. It can be seen that for limiting the adsorbed amount of Al to $10^{11}$ atoms/cm$^2$ or less, the Al concentration in the SC-1 treating solution should be controlled to 0.01 ppb or less.

The surface treating agents described in Example 1 are markedly effective in preventing Al adsorption as compared with Comparative Example 1. When the Al concentration in the SC-1 treating solution is controlled to 0.1 ppb, the adsorbed amount of Al can be limited to $10^{11}$ atoms/cm$^2$ or less by adding desferrichrome A in an amount of $10^{-5}\%$. When the Al concentration in the SC-1 treating solution is controlled to 1 ppb, the adsorbed amount of Al can be limited to $10^{11}$ atoms/cm$^2$ or less by adding desferrichrome A in an amount of $10^{-4}\%$. That is, the purpose can be achieved by adding the complexing agent in such a small amount that the contamination with carbon can be neglected.

EXAMPLE 2

FIG. 2 shows relationships between the concentration of complexing agent in the SC-1 treating solution containing 1 ppb of Al and the adsorbed amount of Al on the silicon wafer surface which were determined for comparing desferrioxamine B according to the present invention (-○-) with EDTA (-●-), CyDTA (-■-) and MDP (-▲-) (methyl diphosphonic acid) which are considered to have a powerful masking effect on Al. The complexing agent of the present invention is effective at a concentration of $10^{-7}\%$ or more and can limit the adsorbed amount of Al to $10^{11}$ atoms/cm$^2$ or less at a concentration of $10^{-4}\%$. On the other hand, the concentration of EDTA, CyDTA or MDP required for limiting the adsorbed amount of Al to $10^{11}$ atoms/cm$^2$ or less is $10^{-2}\%$, $10^{-1}\%$ or 5×10-3%, respectively.

Comparative Example 2

To the SC-1 treating solution containing 1 ppb of Al was added each of various complexing agents in an amount of $10^{-4}\%$, and the adsorbed amount of Al on silicon wafer surface was measured. The results are shown in Table 1.

TABLE 1

| Complexing agent | Concentration of complexing agent (%) | Adsorbed amount of Al (atoms/cm$^2$) |
|---|---|---|
| Desferrioxamine B mesylate | $10^{-4}$ | $8 \times 10^{10}$ |
| Triethanolamine | $10^{-4}$ | $1 \times 10^{12}$ |
| EDTA | $10^{-4}$ | $8 \times 10^{11}$ |
| CyDTA | $10^{-4}$ | $9 \times 10^{11}$ |
| NTA | $10^{-1}$ | $1 \times 10^{12}$ |
| MDP | $10^{-4}$ | $5 \times 10^{11}$ |
| No addition | — | $3 \times 10^{12}$ |

EXAMPLE 3

A SC-1 treating solution was prepared in the same manner as described in Example 1 except for using ammonia water (28%) to which desferrirhodin had previously been added in an amount of $10^{-4}\%$. The desferrirhodin concentration in the treating solution was 1.5×10-5%. To the treating solution was added 1 ppb of Al, and cleaning treatment was carried out using the resulting solution. Then, the adsorption of Al on wafer surface was investigated to find that the adsorbed amount of Al was $2 \times 10^{11}$ atoms/cm$^2$.

Using the SC-1 treating solution (desferrirhodin concentration: 1.5×10-5%) to which no Al had been added, a silicon wafer whose surface had previously been contaminated with $10^{13}$ atoms/cm$^2$ of Al was cleaned at 70° C. for 10 minutes and then rinsed with pure water for 10 minutes (the same Al contaminated wafer as above and the same cleaning conditions as above were used in the SC-1 cleaning experiments described hereinafter). The remaining amount of Al on wafer surface was $3 \times 10^{11}$ atoms/cm$^2$, namely, the remaining rate (the percentage of the remaining amount based on the initial contaminating amount) was 3%. Thus, the cleaning efficiency for Al of the SC-1 treating solution was improved by a factor of 10 or more.

Comparative Example 3

The same adsorption experiments and cleaning experiments as in Examples 3 were repeated except that each of EDTA and various chelating agents similar to EDTA and having a larger chelate stability constant was used in place of desferrirhodin in the same concentration (1.5×10-5%) as the desferrirhodin concentration. The results obtained are shown in Table 2 in comparison with the results of Example 3.

TABLE 2

| Complexing agent ($10^{-4}\%$ based on ammonia water) | Adsorbed amount from SC-1 solution containing 1 ppb of Al (atoms/cm$^2$) | Al remaining rate after cleaning with SC-1 solution (%) |
|---|---|---|
| EDTA | $1 \times 10^{12}$ | 40 |
| CyDTA | $2 \times 10^{12}$ | 41 |
| TTHA | $2 \times 10^{12}$ | 42 |
| Desferrirhodin | $2 \times 10^{11}$ | 3 |
| No addition | $3 \times 10^{12}$ | 42 |

It can be seen that EDTA and the chelating agents similar to EDTA hardly have inhibitory effect on Al adsorption and improved cleaning efficiency at a concentration of 1.5×10-5%.

EXAMPLE 4

Each of BAMTPH, desferricrocin, desferrimycin, desferrirubin, and tri-O-methyl-desferrioxamine E (TM-desferrioxamine E) which is a derivative of desferrioxamine E, was incorporated into SC-1 treating solution in an amount of $10^{-4}\%$ as a complexing agent of the present invention, whereby surface treating agents of the present invention were prepared. Using each of these SC-1 treating solutions, a silicon wafer contaminated with $10^{13}$ atoms/cm$^2$ of Al was cleaned and the remaining amount of Al after the cleaning was measured. The remaining rate of Al was calculated from the remaining amount and is shown in Table 3.

Comparative Example 4

The same cleaning experiment as in Example 4 was repeated except for using each of the following treating solutions: treating solutions prepared by adding each of three generally used typical chelating agents, i.e., EDTA, acetylacetone and nitrilotris-(methylene phosphonic acid) (NTPO) to SC-1 treating solution in an amount of $10^{-4}\%$ in place of the complexing agent of the present invention, and SC-1 treating solution to which no chelating agent had been added. The thus obtained values of the remaining rate of Al are also shown in Table 3.

TABLE 3

|  | Complexing agent | Al remaining rate after cleaning (%) |
|---|---|---|
| Example 4 | BAMTPH | 2 |
|  | Desferricrocin | 3 |
|  | Desferrimycin | 3 |
|  | Desferrirubin | 2 |
|  | TM-desferrioxamine E | 4 |
|  | No addition | 42 |
| Comparative | EDTA | 40 |
| Example 4 | Acetylacetone | 40 |
|  | NTPO | 15 |

As is clear from Table 3, the semiconductor surface treating agents of the present invention exhibit markedly improved cleaning effects against Al by addition of each complexing agent of the present invention in an amount of as very small as $10^{-4}\%$. In contrast, when EDTA or acetylacetone, which can form a cyclic chelate like the complexing agent of the present invention, was added in such a small amount, effects like those obtained by the present invention could hardly be obtained.

EXAMPLE 5

A treating solution containing an organic alkali and hydrogen peroxide was prepared in the same manner as in Example 1 except for using a 1% tetra-methylammonium hydroxide (TMAH) aqueous solution in place of 28% ammonia water. Desferrichrome A, a complexing agent of the present invention was added to the treating solution as in Example 1, and the adsorption of Al on a silicon wafer surface from the resulting cleaning solution was tested in the same manner as described in Example 1 (70° C., 10 minutes). As a result, substantially the same Freundlich plots as dotted lines in FIG. 1 were obtained.

From the results described above, it can be seen that the complexing agent of the present invention has a powerful inhibitory effect on Al adsorption in treating solutions containing an alkali and hydrogen peroxide, irrespective of whether the alkali is inorganic or organic.

EXAMPLE 6

Each of desferrichrysin and desferrioxamine E was added to the same treating solution as used in Example 5, in place of desferrichrome A. The adsorption of Al from the thus obtained treating solutions and their cleaning ability against Fe were tested. The amount of each complexing agent added was $10^{-4}\%$. A silicon wafer contaminated with $10^{13}$ atoms/cm$^2$ of Al was cleaned with each treating solution at 70° C. for 10 minutes and rinsed with pure water for 10 minutes, after which the remaining rate of Al was determined. In addition, 1 ppb of Al was added to each treating solution, and a clean silicon wafer was treated in the same manner as above except for using the resulting contaminated treating solution, and the adsorbed amount of Al on the wafer surface was measured. The results obtained are shown in Table 4.

TABLE 4

| Complexing agent ($10^{-4}$ of treating solution) | Adsorbed amount of Al from treating solution containing 1 ppb of Al (atoms/cm$^3$) | Remaining rate of Al after cleaning (%) |
|---|---|---|
| Desferrichrysin | $1 \times 10^{11}$ | 2.0 |
| Desferrioxamine E | $9 \times 10^{10}$ | 1.5 |

From the above results, it can be seen that the effects of the complexing agents of the present invention do not change, whether inorganic alkali or organic alkali is used.

EXAMPLE 7

Semiconductor surface treating agents were prepared by the following three methods A, B and C using 28% ammonia water, 35% hydrogen peroxide solution and water in proportions of 1 part by volume, 1 part by volume and 5 parts by volume, respectively.

Method A:

Desferrichrome A was dissolved in 28% ammonia water so as to adjust the final concentration of desferrichrome A in surface treating agent to $10^{-4}\%$, and the resulting solution was mixed with hydrogen peroxide solution and water.

Method B:

Desferrichrome A was dissolved in hydrogen peroxide solution so as to adjust the final concentration of desferrichrome A in surface treating agent to $10^{-4}\%$, and the resulting solution was mixed with 28% ammonia water and water.

Method C:

Desferrichrome A was dissolved in water so as to adjust the final concentration of desferrichrome A in surface treating agent to $10^{-4}\%$, and the resulting solution was mixed with 28% ammonia water and hydrogen peroxide solution.

After adding 1 ppb of Al to each of the thus prepared three treating agents, silicon wafers were cleaned and rinsed in the same manner as described in Example 1, and the adsorbed amount of Al on each surface of silicon wafer was measured. The results obtained are shown in Table 5.

TABLE 5

| Method | Adsorbed amount of Al (atoms/cm$^2$) |
|---|---|
| A | $9 \times 10^{10}$ |
| B | $9 \times 10^{10}$ |
| C | $9 \times 10^{10}$ |

As is clear from Table 5, the complex formation ability appears in the same manner and there is no significant difference in the effectiveness for prevention of Al adsorption and cleaning against Al even if the complexing agent of the present invention is added first to any of the ammonia water, hydrogen peroxide solution or water, which constitute each surface treating agent. Further, as shown in Examples 1 and 3 to 6, the complexing agent of the present invention can also be added to a mixture of the ammonia water, hydrogen peroxide solution or water without lowering the effects. It can be seen that a method for preparing the surface treating agent is not particularly limited.

EXAMPLE 8

To ultra-pure water containing 0.01 ppb of Al was added 0.1 ppb of Al, followed by pH adjustment with ammonia water to pH 8.5. A silicon wafer was dipped in the resulting water for 10 minutes to cause the Al adsorption of $8 \times 10^{11}$ atoms/cm$^2$. Separately, 0.1 ppb of Al was added to ultra-pure water containing 0.01 ppb of Al and BAMTPH was added thereto in an amount of $10^{-5}\%$, followed by pH adjustment with ammonia water to pH 8.5. Then, the same dipping treatment as above was carried out to find that the adsorbed amount of Al on silicon wafer surface was $8 \times 10^{10}$ atoms/cm$^2$.

As described above, even if the complexing agent of the present invention is used in the form of a solution in water for rinsing, it exhibits the complex formation ability in the same manner and retains the effectiveness for prevention of Al adsorption and cleaning against Al.

EXAMPLE 9

Semiconductor treating solutions were prepared from SC-1 treating solution by the following 4 methods.
Method D:
No complexing agent was added.
Method E:
Desferrichrome A was added in an amount of $10^{-5}\%$.
Method F:
NTPO was added in an amount of $10^{-5}\%$.
Method G:
Desferrichrome A and NTPO were added each in an amount of $10^{-5}\%$.

To each of the thus prepared 4 treating agents was added 1 ppb each of Al and Fe, after which silicon wafers were cleaned and rinsed in the same manner as described in Example 1, and the adsorbed amounts of Al and Fe on each surface of silicon wafer were measured. The results are shown in Table 6.

TABLE 6

| Method | Adsorbed amount of Al (atoms/cm$^2$) | Adsorbed amount of Fe (atoms/cm$^2$) |
| --- | --- | --- |
| D | $3 \times 10^{12}$ | $2 \times 10^{12}$ |
| E | $2 \times 10^{11}$ | $5 \times 10^{11}$ |
| F | $8 \times 10^{11}$ | $4 \times 10^{10}$ |
| G | $2 \times 10^{11}$ | $3 \times 10^{10}$ |

As is clear from Table 6, the complexing agent of the present invention does not lessen the inhibitory effect on Fe adsorption of a phosphonic acid type complexing agent such as NTPO, and also has a small inhibitory effect on Fe adsorption in itself. It can also be seen that the phosphonic acid type complexing agent such as NTPO does not lessen the inhibitory effect on Al adsorption of the complexing agent of the present invention.

EXAMPLE 10

To SC-1 treating solution were added 1 ppb of Al and then an n-dodecylbenzenesulfonic acid ammonium salt as a typical surfactant in an amount of $10^{-2}\%$, and silicon wafers were cleaned and rinsed in the same manner as described in Example 1. The adsorbed amount of Al on each surface of silicon wafer were measured and found to be $1 \times 10^{12}$ atoms/cm$^2$.

Desferrioxamine A hydrochloride, a complexing agent of present invention was added to the SC-1 treating solution containing the surfactant, in an amount of $10^{-4}\%$. Using the thus obtained treating solution, silicon wafers were cleaned and rinsed in the same manner as above, and the adsorbed amount of Al on each surface of silicon wafer was measured and found to be $7 \times 10^{10}$ atoms/cm$^2$ or less.

From the results of Example 10, it can be seen that the addition of the surfactant does not lessen the inhibitory effect on Al adsorption of the complexing agent of the present invention.

EXAMPLE 11

Desferrichrome A was added to a SC-1 treating solution containing 1 ppb of Al, in an amount of $10^{-4}\%$ or $10^{-5}\%$ as a complexing agent of the present invention, and the same cleaning experiment as in Example 1 was carried out except for using each of the thus obtained treating solution and an ultrasonic cleaner of 50 kHz frequency in a cleaning bath. As a result, the concentration of Al adsorbed on wafer surface was $8 \times 10^{10}$ atoms/cm$^2$ or $1.4 \times 10^{11}$ atoms/cm$^2$ at an amount of desferrichrome A of $10^{-4}\%$ or $10^{-5}\%$, respectively. Thus, the employment of the ultrasonic cleaner improved the inhibitory effect on Al adsorption.

In cleaning treatment using "alkali and hydrogen peroxide" which is not only very effective in removing fine particulates but also fairly effective in removing contamination with fats and oils, it has been impossible to avoid the adsorption of Al, a harmful impurity metal having undesirable influences on silicon wafers. However, the Al concentration on silicon surface can be reduced to such an extent that Al does not affect the growth rate of an oxide film during thermal oxidation, by adding a complexing agent of the present invention to a treating agent used in a semiconductor surface treating procedure or a rinsing solution in such a small amount that the complexing agent does not cause harmful contamination with organic materials. The effects of the present invention are not limited to the composition of "alkali and hydrogen peroxide". It is known that the adhesive strength of fine particulates to silicon wafers decreases with an increase of the pH. But, at a pH of higher than 3, Al in the presence of water shows a strong tendency to form colloid so as to increase a danger of Al contamination. Further, the Al concentration in ultra-pure water used for rinsing is very likely to increase to about 0.1 ppb. The complexing agent of the present invention prevents also such Al contamination by adsorption.

Needless to say, the treating process and treating agent of the present invention are effective not only for silicon single crystal surfaces but also for polycrystal film surfaces. Therefore, they are effective also in cleaning glass substrates for LCD using such films. Further, they are applicable to compound semiconductors which tend to be damaged by Al contamination. In addition, they can be widely used in the production process of wafers as materials and the production process of patterned devices. The surface treating agent of the present invention is industrially very useful because of its immeasurable far-reaching effects.

What is claimed is:
1. A process for treating semiconductor surfaces, which comprises a step of cleaning surfaces of semiconductors with a semiconductor surface treating agent comprising an inorganic or organic alkali, hydrogen peroxide and water as major components, and a step of rinsing the resulting surfaces with ultra-pure water, wherein at least one of the semiconductor surface treating agent and the ultra-pure water contains a complexing agent $$\begin{matrix} O & OH \end{matrix}$$

having three or more —C—N— groups in the molecule or a salt thereof and in addition to said complexing agent a chelating agent for removing Fe having one or more phosphonic acid groups or a salt thereof in the molecule or an oxidized form thereof, or a polyphosphoric acid or a salt thereof.

2. A process according to claim 1, wherein the semiconductor surface treating agent contains the complexing agent.

3. A process according to claim 1, wherein ultra-pure water contains the complexing agent.

4. A process according to claim 1, wherein the alkali is ammonia or a quaternary ammonium hydroxide.

* * * * *